United States Patent
Brandt et al.

(10) Patent No.: US 10,846,165 B2
(45) Date of Patent: Nov. 24, 2020

(54) ADAPTIVE SCAN FREQUENCY FOR DETECTING ERRORS IN A MEMORY SYSTEM

(71) Applicant: Micron Technology, Inc., Boise, ID (US)

(72) Inventors: Kevin R. Brandt, Boise, ID (US); William C. Filipiak, Boise, ID (US); Michael G. McNeeley, Boise, ID (US); Kishore K. Muchherla, Fremont, CA (US); Sampath K. Ratnam, Boise, ID (US); Akira Goda, Boise, ID (US); Todd A. Marquart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 260 days.

(21) Appl. No.: 15/982,653

(22) Filed: May 17, 2018

(65) Prior Publication Data
US 2019/0354421 A1 Nov. 21, 2019

(51) Int. Cl.
*G06F 11/00* (2006.01)
*G06F 11/07* (2006.01)
*G11C 29/10* (2006.01)

(52) U.S. Cl.
CPC ........ *G06F 11/079* (2013.01); *G06F 11/0727* (2013.01); *G06F 11/0751* (2013.01); *G11C 29/10* (2013.01)

(58) Field of Classification Search
CPC .............. G06F 11/079; G06F 11/0727; G06F 11/0751; G11C 29/10
See application file for complete search history.

(56) References Cited

U.S. PATENT DOCUMENTS

| | | | | |
|---|---|---|---|---|
| 6,993,690 B1* | 1/2006 | Okamoto | ............... | G11C 16/20 365/185.33 |
| 7,356,442 B1* | 4/2008 | Astigarraga | .......... | G06F 11/008 702/182 |
| 7,444,490 B2* | 10/2008 | Cases | .................. | G06F 13/4072 327/509 |
| 7,447,936 B2* | 11/2008 | Shiota | .................. | G11C 16/349 714/6.1 |
| 7,496,810 B2* | 2/2009 | Hara | .................. | G11C 16/3454 714/718 |
| 7,873,883 B2* | 1/2011 | Browne | ................ | G06F 11/106 714/42 |

(Continued)

OTHER PUBLICATIONS

International Search Report and Written Opinion from related international application No. PCT/US2019/032644, dated Sep. 6, 2019, 12 pages.

*Primary Examiner* — Esaw T Abraham
(74) *Attorney, Agent, or Firm* — Brooks, Cameron & Huebsch, PLLC

(57) ABSTRACT

Performing a first set of scans on a memory device in a memory system with a first time interval between each scan of the first set of scans to detect errors on the memory device, determining, from performing the first set of scans, that a rate of errors being detected on the memory device is changing, and performing a second set of scans with a second time interval between each scan of the second set of scans to detect errors on the memory device, in response to determining that the rate of errors being detected on the memory device is changing, wherein the second time interval is different than the first time interval.

20 Claims, 3 Drawing Sheets

(56) References Cited

U.S. PATENT DOCUMENTS

| | | | |
|---|---|---|---|
| 8,255,772 B1* | 8/2012 | Foley | G11C 29/028 |
| | | | 714/718 |
| 8,862,952 B1 | 10/2014 | Booth et al. | |
| 8,984,367 B2* | 3/2015 | Ekas | G06F 11/1048 |
| | | | 714/763 |
| 9,423,971 B2 | 8/2016 | Song et al. | |
| 9,558,054 B2* | 1/2017 | Wakuda | G06F 11/076 |
| 9,916,835 B2* | 3/2018 | Frey | G10L 19/005 |
| 10,297,335 B2* | 5/2019 | Dodson | G11C 29/44 |
| 10,498,882 B2* | 12/2019 | Obaidi | G06F 21/32 |
| 2013/0007543 A1 | 1/2013 | Goss et al. | |
| 2013/0346805 A1 | 12/2013 | Sprouse et al. | |
| 2014/0173239 A1 | 6/2014 | Schushan | |
| 2014/0211561 A1 | 7/2014 | Li | |
| 2015/0363261 A1 | 12/2015 | Warnes et al. | |
| 2016/0118132 A1 | 4/2016 | Prins et al. | |
| 2017/0177425 A1 | 6/2017 | Jei et al. | |
| 2018/0109614 A1 | 4/2018 | Khadiwala et al. | |

* cited by examiner

ADAPTIVE SCAN FREQUENCY FOR DETECTING ERRORS IN A MEMORY SYSTEM

TECHNICAL FIELD

The present disclosure relates generally to a memory system, and, more particularly, to an adaptive scan frequency for detecting errors in a memory system.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
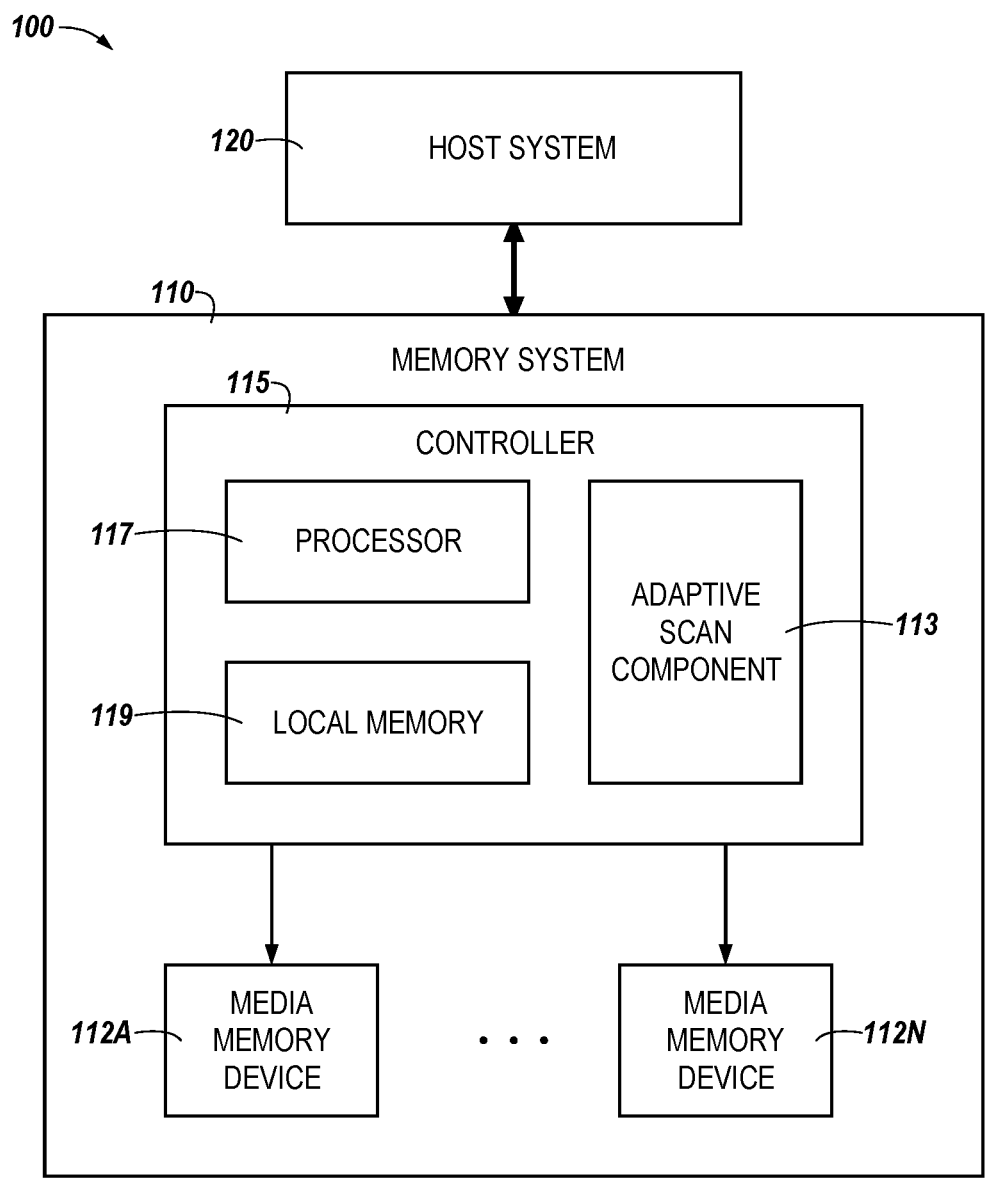
FIG. 1 illustrates an example computing environment including a memory system in accordance with a number of embodiments of the present disclosure.

Aspects of the present disclosure are directed to adjusting frequency of scans for detecting errors in a memory device in a memory system. The memory system can be a storage system, such as a solid-state drive (SSD). In some embodiments, the memory system is a hybrid memory/storage system. In general, a host system can utilize a memory system that includes one or more memory devices. The memory devices can include non-volatile memory devices, such as, for example, negative-and (NAND). The host system can provide write requests to store data at the memory devices of the memory system and can provide read requests to retrieve data stored at the memory system.

Memory systems are capable of scans (e.g., background scans) to detect errors (e.g., media defects) in memory devices. The memory devices can degrade as a result of errors occurring more frequently. A scan can detect and correct errors and/or manage the errors. With conventional memory systems, the scan is generally executed at a regular rate. For example, a scan can be conducted every 24 hours. However, if the errors are occurring more frequently than a scan rate, the scan of a conventional memory system may not be able to detect the errors in time to correct the errors, which may result in data corruption and/or data loss.

Aspects of the present disclosure address the above and other deficiencies by performing scans with an adaptive scan frequency. Embodiments of the present disclosure include scanning memory devices with a frequency that can change on-the-fly in response to the rate at which errors are being detected. In various embodiments, frequency of scans can be adjusted in response to the degradation of the memory devices accelerating over time. For example, a scan frequency can be initially set to occur every 24 hours. A first error may be detected after 4 scans, a second error may be detected after 3 more scans, and a third error may be detected after 2 more scans. This error data can indicate the memory degradation is accelerating and that an error will likely occur faster than the 24 hours scan rate, which can result in an uncorrectable error. In response, the present disclosure dynamically increases the scan frequency. For example, the scans are changed on-the-fly to occur every 12 hours instead of every 24 hours. In another example, the present disclosure describes dynamically decreasing the scan frequency in response to the error data indicating errors occurring less frequently. Decreasing the scan frequency can reduce power consumption of the computing device, for example.

In a number of embodiments, a particular location on a memory device can have a particular scan frequency. For example, if one or more word lines are failing more frequently than other word lines, the one or more word lines can be scanned more frequently than the other word lines.

As described further herein, a change in frequency of errors can trigger particular operations. For example, an increase in frequency of errors can indicate a memory device may be degrading. Blocks and/or word lines of a memory device can be retired in response to reaching a threshold frequency of errors to prevent data corruption and/or data loss due to one or more uncorrectable errors. In some embodiments, trim settings are adjusted in response to a change in frequency of errors.

FIG. 1 illustrates an example computing environment 100 including a memory system 110, in accordance with a number of embodiments of the present disclosure. The memory system 110 can include media, such as memory devices 112A to 112N. The memory devices 112A to 112N can be volatile memory devices, non-volatile memory devices, or a combination of such. In some embodiments, the memory system 110 is a storage system. An example of a storage system is a solid-state drive (SSD). In general, the computing environment 100 can include a host system 120 that uses the memory system 110. In some implementations, the host system 120 can write data to the memory system 110 and read data from the memory system 110. In some embodiments, the memory system 110 is a hybrid memory/storage system.

The host system 120 can be a computing device such as a desktop computer, laptop computer, network server, mobile device, or such computing device that includes a memory and a processing device. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory devices 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 120. Although non-volatile memory devices such as NAND type flash memory are described, the memory devices 112A to 112N can be based on any other type of memory such as a volatile memory. In some implementations, the memory devices 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The controller 115 can communicate with the memory devices 112A to 112N to perform operations such as reading data, writing data, or erasing data at the memory devices 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor 117 (processing device) configured to execute instructions stored in local memory 119. In the illustrated example, the local memory 119 of the controller 115 includes an embedded memory configured to store instructions for performing various processes, operations, logic flows, and routines that control operation of the memory system 110, including handling communications between the memory system 110 and the host system 120. In some embodiments, the local memory 119 can include memory registers storing, e.g., memory pointers, fetched data, etc. The local memory 119 can also include read-only memory (ROM) for storing micro-code. While the example memory system 110 in FIG. 1 has been illustrated as including the controller 115, in another embodiment of the present disclosure, a memory system 110 may not include a controller 115, and may instead rely upon external control (e.g., provided by an external host, or by a processor or controller separate from the memory system).

In general, the controller 115 can receive commands or operations from the host system 120 and can convert the commands or operations into instructions or appropriate commands to achieve the desired access to the memory devices 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory devices 112A to 112N. The controller 115 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

The memory system 110 can include an adaptive scan component 113 (e.g., circuitry, dedicated logic, programmable logic, firmware, etc.) to perform the operations described herein. The adaptive scan component 113 can set a particular scan rate for scanning the memory devices 112A to 112N, and can dynamically change the scan rate in real-time in response to the rate of errors being detected with the scans. As used herein, the term real-time is used to indicate events that occur proximate in time to their cause, e.g., without unnecessary delay. For example, the adaptive scan component 113 can perform a first number of scans with a first time interval between each of the first number of scans to detect errors on the memory devices 112A to 112N and cause the controller 115 to correct the errors. The adaptive scan component 113 can determine whether there is a change in the frequency of errors being detected. For example, the adaptive scan component 113 can determine that errors are being detected more frequently or less frequently. In response to the change in the frequency of errors being detected, the adaptive scan component 113 can modify the scan rate in real-time to change the frequency of subsequent scans to be performed. For example, if the errors are being detected more frequently, the adaptive scan component 113 can increase the frequency of scanning the memory devices 112A to 112N. In another example, if the errors are being detected less frequently, the adaptive scan component 113 can decrease the frequency of scanning the memory devices 112A to 112N.

In a number of embodiments, the adaptive scan component 113 can trigger adjustable algorithmic, voltage, current, and/or time-based settings of the memory system 110 to be adjusted in response to a change in frequency of errors. For example, the adaptive scan component 113 can send a notification to the controller 115 to adjust trim settings (e.g., read and/or write voltages) for the memory device 112A to 112N, in response to the first number of scans detecting errors with changing frequency. Examples of adjusting trim settings include, and are not limited to, adjusting read and/or write voltages, read and/or write currents, time-based settings, and algorithms. Firmware in the memory system 110 can include an algorithm for adjusting trim settings based on characteristics of the errors, for example.

In a number of embodiments, the memory devices 112A to 112N include sections. A memory device 112A to 112N can include sections, such as, and not limited to channels, packages, dies, planes, blocks, pages, cells, etc.). Memory cells of the memory device 112A to 112N can be arranged in rows (e.g., each corresponding to a word line) and columns (e.g., each corresponding to a bit line). For example, the memory device may include a first section and a second section. The adaptive scan component 113 can monitor the frequency of errors being detected for the sections. Firmware in the memory system 110 can count errors and track power on time in hours, minutes, seconds, etc.

The adaptive scan component 113 can trigger a section of the memory device 112A to 112N to be retired, in response to the section reaching a threshold frequency of errors. For example, firmware in the memory system 110 can include a threshold number of errors in a certain area. When an area reaches its threshold number of errors the memory system 110 will retire the area. In some examples, the area is a die. The sections can each have different thresholds or groups of sections can have thresholds different from each other. The threshold frequency for a section can be pre-configured and/or user defined. For example, the first section and/or the second section can be one or more word lines. If one or more word lines reach a threshold frequency of errors, the one or more word lines can be retired to prevent data loss.

In a number of embodiments, the adaptive scan component 113 can set a scan frequency for a particular section on the memory device 112A to 112N. The scan frequency for a particular section of the memory device can be different than another section of the memory device 112A to 112N. In response to a first number of scans detecting errors with changing frequency in the first section, a second number of scans can be performed in the first section of the memory device 112A to 112N. The second number of scans can have a second time interval between each of the second number of scans that is different from a first time interval between each of the first number of scans. In some embodiments, the first section and/or the second section can be one or more word lines. For example, if one or more word lines are failing more frequently than other word lines, the one or more word lines can be scanned more frequently that the other word lines.

The adaptive scan component 113 can dynamically change the scan rate for scanning the memory device 112A to 112N multiple times. For example, the adaptive scan component 113 may detect that errors are occurring less frequently and may adjust the scan rate to scan the memory device less frequently. Subsequently, the adaptive scan component 113 may detect that errors are occurring more frequently and may adjust the scan rate to scan the memory device more frequently.

The memory system 110 can include additional circuitry or components that are not illustrated. For example, the memory system 110 can include a cache or buffer (e.g., DRAM) and address circuitry (e.g., a row decoder and a column decoder) that may receive an address from the controller 115 and decode the address to access the memory devices 112A to 112N.

Figure 2:
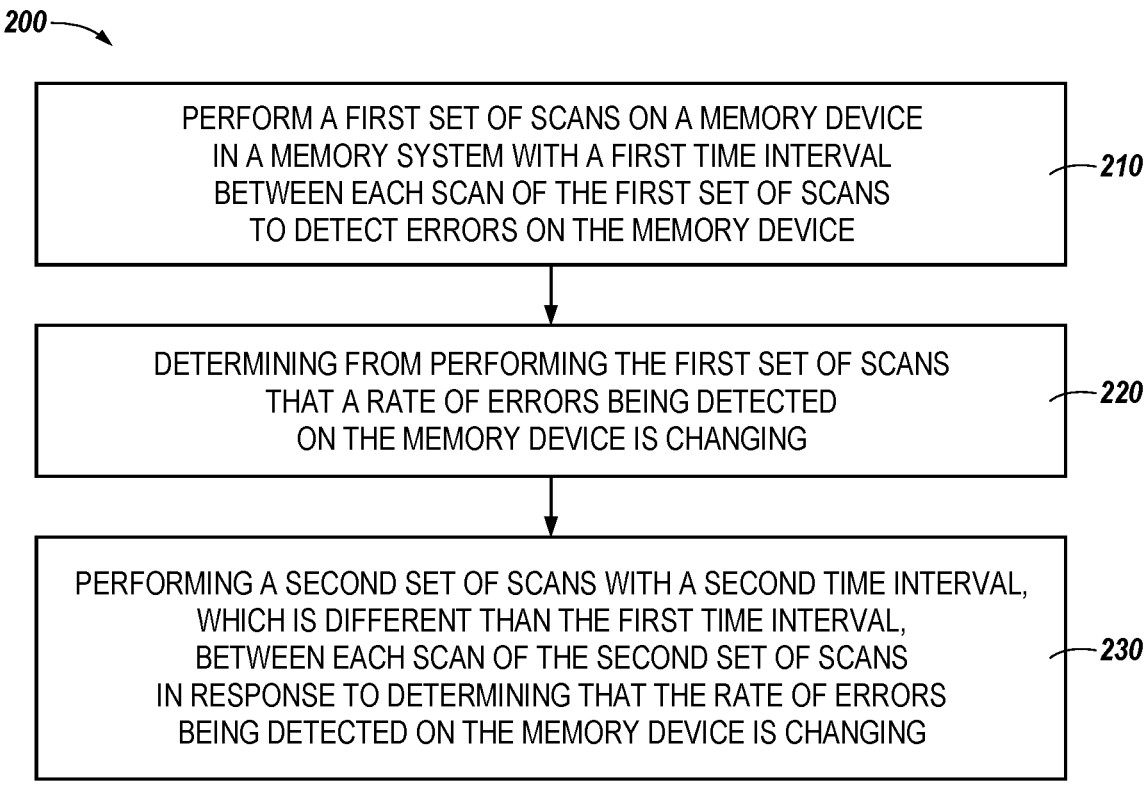
FIG. 2 is a flow diagram of an example method to dynamically change a scan frequency in detecting errors in a memory system in accordance with a number of embodiments of the present disclosure.

FIG. 2 is a flow diagram of an example method 200 to dynamically change a scan frequency in detecting errors in a memory system, in accordance with some implementations of the present disclosure. Method 200 can be performed by processing logic that can include hardware (e.g., circuitry, dedicated logic, programmable logic, microcode, etc.), software (such as instructions run on a processing device), firmware, or a combination thereof. In one embodiment, the adaptive scan component 113 of FIG. 1 can perform method 200. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 210, the processing device performs a first set of scans on a memory device in a memory system with a first time interval between each scan of the first set of scans to detect errors on the memory device. In some embodiments, the memory system is a solid-state drive. The time interval can be set in, for example, days, hours, minutes, and/or seconds, or any combination of such. The time interval can be configurable, pre-defined, and/or user-defined.

At block 220, the processing device determines, from performing the first set of scans, that a rate of errors being detected on the memory device is changing, as described in greater detail below in conjunction with FIG. 3.

At block 230, the processing device performs a second set of scans with a second time interval between each scan of the second set of scans in response to determining that the rate of errors being detected on the memory device is changing. The second time interval is different than the first time interval.

If the rate of errors occurring on the memory device is changing with increasing frequency, the processing device can use a second time interval that is less than the first time interval. The processing device can determine the rate of errors occurring the memory device from the results of various scans that are performed.

Figure 3:
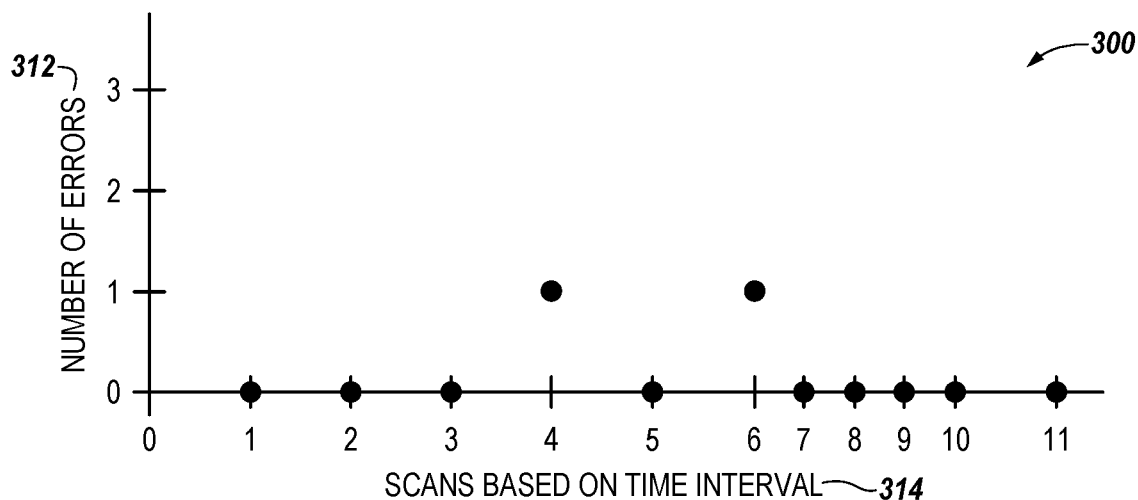
FIG. 3 is a graph of an example of scan results in accordance with a number of embodiments of the present disclosure.

FIG. 3 is a graph 300 of an example of scan results in accordance with a number of embodiments of the present disclosure. The y-axis 312 can represent the number of errors detected from a scan. The x-axis 314 can represent the scans performed based on time intervals. The time intervals between scans can be set in days, hours, minutes, seconds, and/or any combination of such. In this example, the time interval between scans is initially set to 24 hours, such that the scan frequency is initially set at 1 scan per day. On the first day, Scan 1 may not detect any errors. Also, on the second and third days, Scan 2 and Scan 3 may not detect any errors. However, on the fourth day, Scan 4 may detect an error as illustrated in graph 300.

The processing device can determine the rate of errors being detected as a ratio of error detection to the number of scans performed since the last error was detected. For example, the processing device may determine that the first error was detected after 4 scans were performed, and the rate of error detection is 1:4. On day 5, Scan 5 detected no errors. On day 6, Scan 6 detected another error. The processing device may determine that the second error was detected after two more scans were performed, and the new rate of error detection is 1:2.

The processing device can compare the new rate of error detection (e.g., 1:2) to the previous rate of error detection (e.g., 1:4) to determine whether the rate has changed. In this example, since the first error was detected after 4 scans and the second error was detected after 2 scans, the error data indicates the error rate is changing with increasing frequency. To prevent data corruption and/or data loss due to uncorrectable errors, the processing device can adjust the time interval between scans to reduce the time interval, for example, from 24 hours to, for example, 12 hours.

If the rate of errors occurring on the memory device is changing with decreasing frequency, the processing device can use a second time interval that is greater than the first time interval. For example, Scan 7, Scan 8, Scan 9, Scan 10, and Scan 11 may not detect any errors. The processing device can determine that the rate has changed since no errors have been detected with at least performing 2 scans, and the last error was detected after 2 scans. In this example, the processing device can determine that the error rate may be decreasing. To increase performance of the computing system (e.g., computing system 100 in FIG. 1), the processing device can adjust the time interval between scans to increase the time interval, for example, from 12 hours to, for example, 24 hours.

A memory device can include sections, such as, and not limited to channels, packages, dies, planes, blocks, pages, cells, etc.). Memory cells of the memory device can be arranged in rows (e.g., each corresponding to a word line and columns (e.g., each corresponding to a bit line). In some embodiments, the processing device performs the second set of scans with the second time interval on a section of the memory device. In some embodiments, the first set of scans is performed with the first time interval on particular section of the memory device, and the second set of scans is performed with the second time interval on a different section of the memory device.

In some embodiments, the processing device determines whether the rate of errors that are occurring on a section of the memory device meets a threshold. The threshold can be configurable, pre-defined, and/or user-defined. The threshold can be set to a rate of errors occurring or a number of errors occurring. When the threshold is met, the processing device can change the scan rate performed on the memory device. For example, the processing device can perform a second number of scans with a second time interval between each of the second number of scans, in response to detecting a threshold rate of errors for the first number of scans has been met.

Further, the second number of scans can be performed in one or more sections of the memory device. In a number of embodiments of the present disclosure, the error threshold can be set for one or more particular sections of the memory device(s). The sections can each have different thresholds or groups of sections can have thresholds different from each other. For example, a first section can have a different threshold than a second section. The thresholds can be based on the type of memory and/or priority of the data. For example, areas that are 4 bits per cell (e.g., QLC) may be scanned more frequently than bits that are 1 bit per cell (SLC) and firmware meta data, user data, and parity data may be scanned more or less frequently based on priority of the data.

In some embodiments, the processing device can perform one or more actions if the rate of errors that are occurring on a section of the memory device meets the threshold. For example, the processing device can retire the section of the memory device in response to determining that the rate of errors that are occurring on the section meets the threshold. For example, the processing device can retire a first section of the memory device, in response to the first section reaching the threshold (e.g., a threshold rate of errors occurring, a threshold number of errors).

In another example, the processing device can adjust trim settings for the memory device if the rate of errors that are occurring on a section of the memory device meets the threshold. In some embodiments, the processing device adjusts trim settings for the memory device in response to determining that the rate of errors occurring on the memory device is changing.

Figure 4:
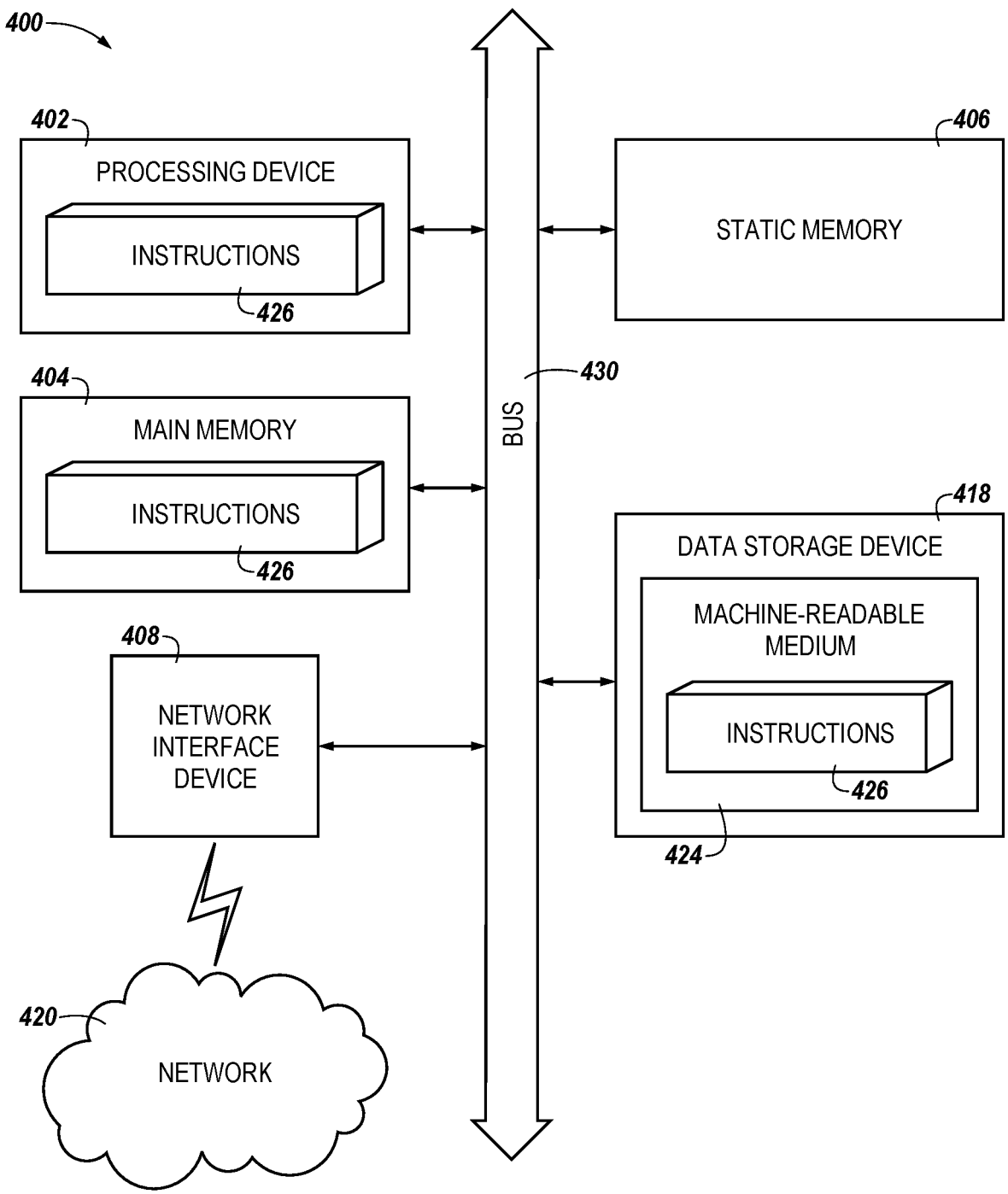
FIG. 4 is a block diagram of an example computer system in which implementations of the present disclosure can operate.

FIG. 4 illustrates an example machine of a computer system 400 within which a set of instructions, for causing the machine to perform any one or more of the methodologies discussed herein, may be executed. For example, the computer system 400 may correspond to a host system (e.g., the host system 120 of FIG. 1) that includes or utilizes a memory system (e.g., the memory system 110 of FIG. 1) or may be used to perform the operations of a controller (e.g., to execute an operating system to perform operations corresponding to the adaptive scan component 113 of FIG. 1). In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein. The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage device 418, which communicate with each other via a bus 430.

Processing device 402 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 may further include a network interface device 408 to communicate over the network 420.

The data storage device 418 may include a machine-readable storage medium 424 (also known as a computer-readable medium) on which is stored one or more sets of instructions or software 426 embodying any one or more of the methodologies or functions described herein. The instructions 426 may also reside, completely or at least partially, within the main memory 404 and/or within the processing device 402 during execution thereof by the computer system 400, the main memory 404 and the processing device 402 also constituting machine-readable storage media. The machine-readable storage medium 424, data storage device 418, and/or main memory 404 may correspond to the memory system 110 of FIG. 1.

In one implementation, the instructions 426 include instructions to implement functionality corresponding to a programming component (e.g., adaptive scan component 113 of FIG. 1). While the machine-readable storage medium 424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, aspects of the present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A method, comprising:
   performing a first set of scans on a memory device in a memory system with a first time interval between each scan of the first set of scans to detect errors on the memory device;
   determining, from performing the first set of scans, a first rate of errors as a ratio of errors detected to a first number of scans of the first set of scans and a second rate of errors as a ratio of errors detected to a second number of scans of the first set of scans;
   determining, from performing the first set of scans, that a rate of errors being detected on the memory device is changing by comparing the first rate of errors to the second rate of errors; and
   performing a second set of scans with a second time interval between each scan of the second set of scans to detect errors on the memory device, in response to determining, from performing the first set of scans, that the rate of errors being detected on the memory device is changing, wherein the second time interval is different than the first time interval.

2. The method of claim 1, wherein the second time interval is less than the first time interval, in response to determining that the rate of errors being detected on the memory device is changing with increasing frequency.

3. The method of claim 1, wherein the second time interval is greater than the first time interval, in response to determining that the rate of errors being detected on the memory device is changing with decreasing frequency.

4. The method of claim 1, wherein performing the second set of scans comprises performing the second set of scans with the second time interval on a section of the memory device.

5. The method of claim 1, wherein the first set of scans is performed with the first time interval on a section of the memory device and the second set of scans is performed with the second time interval on a different section of the memory device.

6. The method of claim 1, further comprising:
determining that the rate of errors that are being detected on a section of the memory device meets a threshold; and
retiring the section of the memory device in response to determining that a rate of errors that are being detected on the section meets the threshold.

7. The method of claim 1, further comprising:
adjusting trim settings for the memory device in response to determining that the rate of errors being detected on the memory device is changing.

8. The method of claim 1, wherein the memory system is a solid-state drive.

9. A system, comprising:
a memory device; and
a processing device coupled to the memory device, wherein the processing device is configured to:
perform a first number of scans with a first time interval between each of the first number of scans to detect errors on the memory device;
detect a rate of errors as a ratio of errors detected to the first number of scans; and
perform a second number of scans with a second time interval between each of the second number of scans to detect errors on the memory device, in response to detecting that the rate of errors being detected on the memory device meets a threshold.

10. The system of claim 9, wherein the second time interval is less than the first time interval, in response to detecting that the rate of errors being detected on the memory device is changing with increasing frequency.

11. The system of claim 9, wherein the second time interval is greater than the first time interval, in response to detecting that the rate of errors being detected on the memory device is changing with decreasing frequency.

12. The system of claim 9, wherein the processing device is further configured to perform the second number of scans in a section of the memory device, in response to detecting that a rate of errors being detected on the section of the memory device meets the threshold.

13. The system of claim 9, wherein the first set of scans is performed with the first time interval on a section of the memory device and the second set of scans is performed with the second time interval on a different section of the memory device.

14. The system of claim 9, wherein the processing device is further configured to retire a section of the memory device, in response to detecting that a rate of errors that are being detected on the section meets a threshold.

15. The system of claim 9, wherein the processing device is further configured to adjust trim settings for the memory device, in response to detecting that the rate of errors being detected on the memory device is changing.

16. The system of claim 9, wherein the system is a solid-state drive.

17. A non-transitory computer-readable storage medium comprising instructions that, when executed by a processing device, cause the processing device to:
perform a first set of scans on a memory device in a memory system with a first time interval between each scan of the first set of scans to detect errors on the memory device;
determine, from performing the first set of scans, a first rate of errors as a ratio of errors detected to a first number of scans of the first set of scans and a second rate of errors as a ratio of errors detected to a second number of scans of the first set of scans;
determine, from performing the first set of scans, that a rate of errors being detected on the memory device is changing by comparing the first rate of errors to the second rate of errors; and
perform a second set of scans with a second time interval between each scan of the second set of scans to detect errors on the memory device, in response to determining, from performing the first set of scans, that the rate of errors being detected on the memory device is changing, wherein the second time interval is different than the first time interval.

18. The non-transitory computer-readable storage medium of claim 17, wherein the second time interval is less than the first time interval, in response to determining that the rate of errors being detected on the memory device is changing with increasing frequency, and the second time interval is greater than the first time interval, in response to determining that the rate of errors being detected on the memory device is changing with decreasing frequency.

19. The non-transitory computer-readable storage medium of claim 17, wherein the first set of scans is performed with the first time interval on a section of the memory device and the second set of scans is performed with the second time interval on a different section of the memory device.

20. The non-transitory computer-readable storage medium of claim 17, wherein the processing device is further configured to:
adjust trim settings for the memory device in response to determining that the rate of errors being detected on the memory device is changing.

* * * * *